United States Patent [19]

Matsuda

[11] Patent Number: 4,617,482
[45] Date of Patent: Oct. 14, 1986

[54] COMPLEMENTARY TYPE MOS FIELD-EFFECT TRANSISTOR CIRCUIT PROVIDED WITH A GATE PROTECTION STRUCTURE OF SMALL TIME CONSTANT

[75] Inventor: Kohei Matsuda, Tokyo, Japan

[73] Assignee: NEC Corporation, Tokyo, Japan

[21] Appl. No.: 659,789

[22] Filed: Oct. 11, 1984

[30] Foreign Application Priority Data

Oct. 12, 1983 [JP] Japan .................. 58-157615[U]

[51] Int. Cl.[4] ............... H03K 17/687; H02H 3/20; H02H 9/00; H01L 27/02
[52] U.S. Cl. .................... 307/579; 307/585; 307/304; 307/200 B; 361/91; 361/56; 357/42; 357/51; 357/23.13
[58] Field of Search ............. 357/23.13, 42, 51; 307/304, 200 B, 570–585; 361/91, 56

[56] References Cited

U.S. PATENT DOCUMENTS 3,967,295 6/1976 Stewart .......................... 361/56
4,514,646 4/1985 Ando et al. .................. 357/23.13

FOREIGN PATENT DOCUMENTS 0055552 7/1982 European Pat. Off. ......... 357/23.13

Primary Examiner—Andrew J. James
Assistant Examiner—R. Limanek
Attorney, Agent, or Firm—Burns, Doane, Swecker and Mathis

[57] ABSTRACT

A complementary type MOS field effect transistor circuit includes an input terminal, a P-MOS FET, an N-MOS FET connected in series with the P-MOS FET, a first resistor connected between the input terminal and the gate of the P-MOS FET, a second resistor connected between the input terminal and the gate of the N-MOS FET, a first diode connected between the gate of the P-MOS FET and a high voltage power supply terminal and a second diode connected between the gate of the N-MOS FET and a low voltage power supply terminal. The gate protection circuit of the circuit has a first part of the first resistor and the second diode and a second part of the second resistor and the second diode.

10 Claims, 2 Drawing Figures

COMPLEMENTARY TYPE MOS FIELD-EFFECT TRANSISTOR CIRCUIT PROVIDED WITH A GATE PROTECTION STRUCTURE OF SMALL TIME CONSTANT

BACKGROUND OF THE INVENTION

1. Field of the Invention

The present invention relates to a complementary type MOS field-effect transistor circuit (hereinafter, referred to as a C-MOS circuit) in which a P-channel MOS field-effect transistor (hereinafter, referred to as a P-MOST) and an N-channel MOS field-effect transistor (hereinafter, referred to as an N-MOST) are connected in series, and more particularly to an improvement of a gate protection structure to be applied to the C-MOS circuit.

2. Description of the Prior Art

An insulated gate field effect transistor has a gate electrode formed upon a thin gate insulator film. The gate insulator film is delicate to an electrostatic voltage and a high voltage noise applied to the gate electrode which cause a dielectric breakdown. In order to protect the gate insulator film from the dielectric breakdown, a protection circuit consisting of a resistor and a diode was heretofore inserted between an input terminal and the gate electrode.

A protection circuit was similarly required in a C-MOS circuit. Such protection circuit in the prior art was a circuit of a resistor and a diode inserted between an input terminal and a connection point of gate electrodes of P-MOST and N-MOST, as disclosed in U.S. Pat. No. 3,673,428 granted for Terry G. Athanas.

More specifically, a P-MOST, a P-well region, a P-type resistor region and a P-type diode region were formed in an N-type silicon substrate. An N-MOST and an N-type diode region were formed in the P-well region. The source-drain paths of the P-MOST and N-MOST were connected in series. The gate electrodes were commonly connected to each other. Thus, a C-MOS circuit was formed. Further, the commonly connected gate electrodes were connected to the P-type and N-type diode regions and to one end of the P-type resistor region. The other end of the P-type resistor region was in turn connected to an input terminal. A protection circuit was thus formed by the P-type and N-type diode regions and the P-type resistor region. Due to such protection circuit, the voltage applied to the gate electrodes of the P-MOST and the N-MOST was limited below the breakdown voltages of the diodes of the P- and N-type diode regions, when a high positive or negative voltage was applied to the input terminal.

The diodes in the protection circuit were reverse biased at a period when an input signal was normal. Under such condition, the reverse biased diodes operate as capacitors due to their junction capacitances. Therefore, the CR time constant of the protection circuit was large. The protection circuit deteriorated the high frequency characteristics of the C-MOS circuit. Furthermore, the protection circuit itself was destroyed by high voltage. There were two measures for enhancing the duration of the protection circuit. One was to enlarge the PN junction areas of the diodes and another was to enlarge the resistance of the resistor. Both measures resulted in further increment of the CR time constant and in additional decrement of high frequency characteristics.

SUMMARY OF THE INVENTION

A primary object of the present invention is to provide a C-MOS circuit provided with a gate protection circuit which has a superior high frequency characteristics.

According to the present invention, the C-MOS circuit comprises an input terminal receiving an input signal, a P-channel type MOS field-effect transistor (P-MOST), an N-channel type MOS field-effect transistor (N-MOST) connected in series with the P-MOST, a first resistor having one end connected with the input terminal and the other end connected with the gate electrode of the P-MOST, a second resistor having one end connected with the input terminal and the other end connected with the gate electrode of the N-MOST, a first diode connected to the gate electrode of the P-MOST and having a breakdown voltage higher than the threshold voltage of the P-MOST but lower than the dielectric breakdown voltage of the gate insulator film in the P-MOST, and a second diode connected to the gate electrode of the N-MOST and having a breakdown voltage higher than the threshold voltage of the N-MOST but lower than the dielectric breakdown voltage of the gate insulator film in the N-MOST.

The C-MOS circuit of the present invention has a first part of protection circuit including a first resistor and a first diode connected between the input terminal and the gate electrode of the P-MOST and a second part of protection circuit including a second resistor and a second diode connected between the input terminal and the gate electrode of the N-MOST. The input signal applied to the gate electrode of the P-MOST is affected by the CR time constant of the first part of the protection circuit. The input signal applied to the gate electrode of the N-MOST is affected by the CR time constant of the second part of the protection circuit. The respective time constants are a multiplication of a resistance of one resistor and a junction capacitance of one diode and are smaller than the time constant of the protection circuit in the prior art which is a multiplication of a resistance of one resistor and a junction capacitance of two diodes. This small time constant improves the high frequency characteristics.

BRIEF DESCRIPTION OF THE DRAWINGS

The above and further objects, features and advantages of the present invention will become more apparent from the following detailed description taken in conjunction with the accompanying drawings, wherein.

Figure 1:
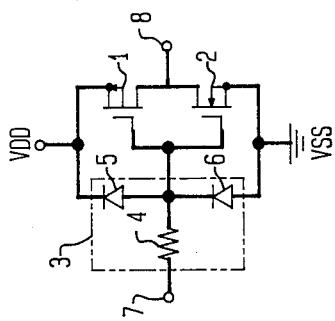
FIG. 1 is a circuit diagram of C-MOS circuit provided with a gate protection circuit in the prior art.

The C-MOS circuit in the prior art provides, as shown in FIG. 1, a gate protection circuit 3 made of a resistor 4 and two diodes 5 and 6. More specifically, a source of a P-MOST 1 is connected with a power source $V_{DD}$. A drain of the P-MOST 1 is connected with a drain of an N-MOST 2 and an output terminal 8. Gate electrodes of the P- and N-MOST's 1 and 2 are commonly connected to the resistor 4 and the diodes 5 and 6. An input terminal 7 is connected to other end of the resistor 4.

When an abnormally high or low voltage is applied to the input terminal 7, the voltage applied to the gate electrodes of the P- and N-MOST's 1 and 2 is clamped to a breakdown voltage of the diode 5 or 6. Thus, the voltage applicable to the gate electrodes is limited to the voltage between the breakdown voltages of the diodes 5 and 6. Therefore, the gate insulator of P- and N-MOST's 1 and 2 are protected from dielectric breakdown.

However, two diodes 5 and 6 are connected with the resistor 4, causing a time constant of a multiplication of the resistance of the resistor 4 and a sum of the capacitances of the diodes 5 and 6. Thus, the time constant of the gate protection circuit 3 is large to deteriorate a high frequency characteristics. The upper limit of the frequency of the input signal which is not distorted is low. The operation speed is low.

If the abnormally high (or low) voltage of the input signal is increased, the diode 5 or 6 which is broken down is destroyed by large current. Measures for improving the gate protection circuit 3 to increase the input voltage by which the gate protection circuit is not destroyed are to make the resistance of the resistor 4 large and to make the PN junction areas of the diodes 5 and 6 wide. Both measures cause a raise in CR time constant of the gate protection circuit 3 and then deteriorate further the high frequency characteristics.

DESCRIPTION OF THE PREFERRED EMBODIMENT

Figure 3:
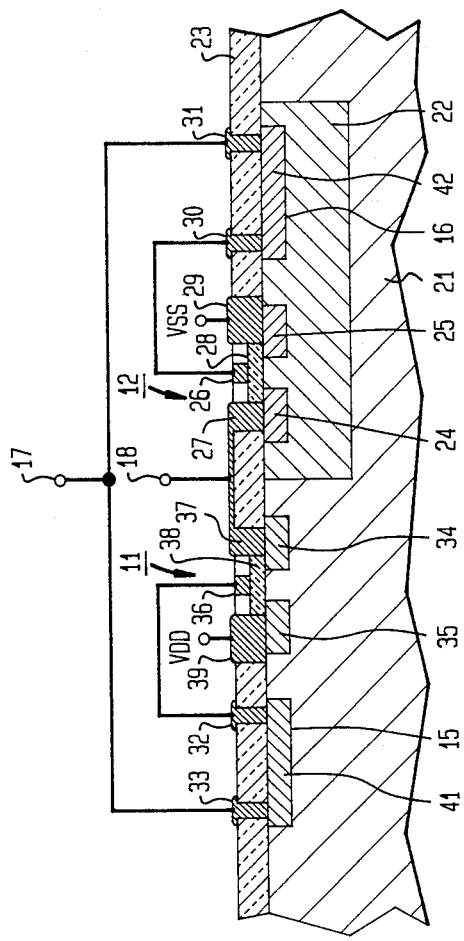
FIG. 3 is a sectional view of the preferred embodiment shown in FIG. 2.
Figure 2:
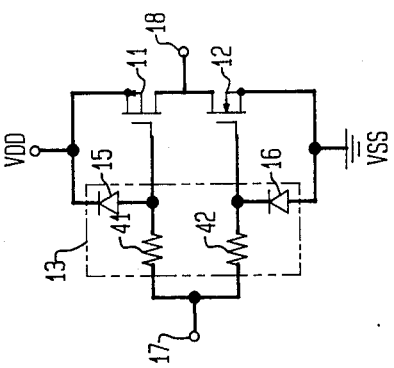
FIG. 2 is a circuit diagram of C-MOS circuit provided with a gate protection circuit according to a preferred embodiment of the present invention.

Referring now to FIGS. 2 and 3, the preferred embodiment is formed in an N-type silicon substrate 21 in which a P-type source region 35, a P-type drain region 34, a P-type resistor region 41 and a P-well region 22 are formed. In the P-well region 22, an N-type source region 25, an N-type drain region 24 and an N-type resistor region 42 are formed. A thick field oxide layer 23 covers the surfaces of the silicon substrate 21 and the P-well region 22 except for surfaces between the source regions 25 and 35 and the drain regions 24 and 34. The field oxide layer 23 has openings for leading electrodes out from the P-type source and drain regions 34 and 35 and the P-type resistor region 41, the N-type source and drain regions 24 and 25 and the N-type resistor region 42. The surfaces between the P-type source and drain regions 35 and 34 and between the N-type source and drain regions 25 and 24 are covered by thin gate insulators 38 and 28 on which gate electrodes 36 and 26 are deposited. The P-type source and drain regions 35 and 34 and the gate electrode 36 form a P-MOST 11. The N-type source and drain regions 25 and 24 and the gate electrode 26 form an N-MOST 12. The P-type drain region 34 and the N-type drain region 24 are led out by the drain electrodes 37 and 27 which are connected to each other and to an output terminal 18. The P-type source region 35 and the substrate 21 are connected to a power supply source $V_{DD}$ through an electrode 39. The N-type source region 25 and the P-well region 22 are connected to a power source $V_{SS}$ (or ground) through an electrode 29. The P-type resistor region 41 has two electrodes 32 and 33. The N-type resistor region 42 has two electrodes 30 and 31. The electrodes 31 and 33 are connected to an input terminal 17. The electrode 32 is connected to the gate electrode 36 of the P-MOST 11. The electrode 30 is connected to the gate electrode 26 of the N-MOST 12.

The PN junctions between the P-type resistor region 41 and the N-type silicon substrate 21 and between the N-type resistor region 42 and the P-well region 22 operates as diodes 15 and 16, respectively. The P-type resistor region 41 and the N-type resistor region 42 form a protection circuit 13 together with their associate diodes 15 and 16. According to one example, the resistances of the resistor formed by the regions 41 and 42 are 500 ohms, respectively. The junction capacitances of the diodes 15 and 16 are about 5 pF, respectively. The time constant by the resistance of the resistor 41 and the capacitance of the diode 15 is favorably equal to that by the resistor 42 and the diode 16 to equalize the delay times of the signals from the input terminal 17 to the gate of P-MOST 11 and to the gate of N-MOST 12. A first part of the gate protection circuit 13 is a path between the input terminal 17 and the gate electrode 36 of the P-MOST 11 and includes a resistor of the resistor region 41 and its associate diode 15. A second part of the gate protection circuit 13 is a path between the input terminal 17 and the gate electrode 26 of the N-MOST 12 and includes a resistor of the resistor region 42 and its associate diode 16. The first and second parts have a common input terminal 17 but are independently connected with gate electrodes 36 and 26 of the P- and N-MOST 11 and 12. Therefore, the CR time constants of respective parts are a multiplication of a resistance of one resistor (41, 42) and a capacitance of one diode (15, 16). That is, if the resistance of the resistor 41, the junction capacitance of the diode 15 and the gate capacitance of the P-MOST 11 are $R_1$, $C_{j1}$ and $C_{01}$, respectively, the time constant $t_1$ of the first part is:

$$t_1 = R_1(C_{j1} + C_{01}) \quad (1)$$

Similarly, if the resistance of the resistor 42, the junction capacitance of the diode 16 and the gate capacitance of the N-MOST 12 are $R_2$, $C_{j2}$ and $C_{02}$, respectively, the time constant $t_2$ of the second part is:

$$t_2 = R_2(C_{j2} + C_{02}) \quad (2)$$

If $R_1 \cdot C_{j1}$ and $R_2 \cdot C_{j2}$ are selected to be same, the symmetrical operation of the P- and N-MOST's 11 and 12 is obtained, because the gate capacitances $C_{01}$ and $C_{02}$ are negligible as compared to the junction capacitances $C_{j1}$ and $C_{j2}$. Under this condition, the time constants $t_1$ and $t_2$ become substantially equal.

Turning back to FIG. 1, if the resistance of the resistor 4, the junction capacitances of the diodes 5 and 6 and the gate capacitances of the P- and N-MOST's 1 and 2 are $R_0$, $C_{j0}$ and $C_0$, respectively, the time constant $t_0$ of the gate protection circuit 3 is as follows:

$$\begin{aligned} t_0 &= R_0(2\ C_{j0} + 2\ C_0) \\ &= 2\ R_0(C_{j0} + C_0) \end{aligned} \quad (3)$$

As apparent from the equations (1), (2) and (3), if the resistances $R_0$ and the junction capacitance $C_{j0}$ are assumed to be same as the resistances $R_1$ and $R_2$ and the junction capacitances $C_{j1}$ and $C_{j2}$, respectively and if the gate capacitances $C_0$, $C_{01}$ and $C_{02}$ are ignored, the time constants $t_1$ and $t_2$ become a half of the time constant $t_0$ as follows:

$$t_1 = t_2 = \tfrac{1}{2} t_0 \quad (4)$$

Therefore, if the resistors and diodes in the embodiment have the same sizes as those in the prior art, the applicable frequency of input signal from which the C-MOS circuit of the present embodiment produces a distortion free output is expanded to be double as compared to the prior art shown in FIG. 1. On the other hand, if the applicable frequency of input signal is remained as same as the prior art, the applicable input voltage may be doubled by making the resistances of the resistors 41 and 42 or the junction areas of the diodes 15 and 16 double. The increment of the resistances may be achieved by controlling impurity density or size of the resistor regions 41 and 42. The expansion of the junction areas of the diodes 15 and 16 may be achieved by controlling the size of the resistor regions 41 and 42 or adding additional diode regions connected with the electrodes 30 and 32.

The above features may be obtained if the equivalent circuit is same as FIG. 2. Therefore, the P-MOST 11, the N-MOST 12, the diodes 15 and 16, the resistors 41 and 42 may be formed by discrete elements. The resistor regions 41 and 42 may be replaced with a combination of diffused diodes and polycrystalline silicon resistors formed on the field oxide layer 23. The use of the combination has a feature that the resistance of resistor and the junction capacitance of diode may be independently controlled with ease. It will be apparent that other modifications may be applied to the invention to form an equivalent circuit shown in FIG. 2.

What is claimed is:

1. A complementary transistor circuit comprising:
an input terminal receiving an input signal;
a first insulated gate field effect transistor of one conductivity type having a gate electrode, a source electrode and a drain electrode;
a second insulated gate field effect transistor of opposite conductivity type having a gate electrode, a source electrode and a drain electrode;
means for connecting said first and second transistors in series;
an output terminal coupled with said connecting means;
a first resistor having one end connected to said gate electrode of said first transistor;
a second resistor having one end connected to said gate electrode of said second transistor;
means for directly connecting the other ends of said first and second resistors in common to said input terminal;
a first diode connected between said gate electrode of said first transistor and a first potential; and
a second diode connected between said gate electrode of said second transistor and a second potential, whereby said input signal is supplied in common to the gate electrodes of said first and second transistors.

2. A complementary transistor circuit as claimed in claim 1, wherein said first and second transistors, said first and second resistors and said first and second diodes are formed on a single semiconductor chip.

3. A complementary transistor circuit as claimed in claim 1, wherein said first and second transistors, said first and second resistors and said first and second diodes are formed in a semiconductor integrated circuit.

4. A complementary transistor circuit as claimed in claim 3, wherein said first and second resistors are polycrystalline silicon resistors.

5. A complementary transistor circuit as claimed in claim 1, wherein said first diode or second diode presents a high impedance when said input signal is in a predetermined voltage range and a low impedance to clamp the voltage of said input signal when said input signal is out of said predetermined voltage range.

6. A complementary transistor circuit comprising:
an input terminal;
an output terminal;
a power supply source having a high voltage terminal and a low voltage terminal;
a P-channel type MOS field effect transistor connected between said high voltage terminal and said output terminal;
an N-channel type MOS field effect transistor connected between said low voltage terminal said output terminal;
a first resistor having one end connected to a gate of said P-channel type MOS field effect transistor;
a second resistor having one end connected to a gate of said N-channel type MOS field effect transistor and the other end connected directly to the other end of said first resistor;
means for connecting said input terminal to the other ends of said first and second resistors;
a first diode having an anode connected with said gate of said P-channel type MOS field effect transistor and a cathode connected with said high voltage terminal; and
a second diode having an anode connected with said low voltage terminal and a cathode connected with said gate of said N-channel type MOS field effect transistor, whereby said P-channel type and N-channel type MOS field effect transistors receive at their gate substantially the same potential level responsive to a potential level of said input terminal and operate in a complementary manner.

7. A semiconductor device comprising:
a semiconductor substrate of one conductivity type;
a well region of the other conductivity type formed in said semiconductor substrate;
a first source region, a first drain region and a first resistor region of said other conductivity type formed in said semiconductor substrate;
a second source region, a second drain region and a second resistor region of said one conductivity type formed in said well region;
a first gate electrode formed on said semiconductor substrate between said first source and drain regions via a first gate insulator film, said gate electrode being connected with one end of said first resistor region;
a second gate electrode formed on said well region between said second source and drain regions via a second gate insulator film, said second gate electrode being connected with one end of said second resistor region;
an input terminal connected directly with other ends of said first and second resistor regions; and
an output terminal connected with said first and second drain regions, whereby substantially the same voltage responsive to a voltage at said input terminal is supplied to said first and second gate electrodes.

8. A complementary transistor circuit comprising:
an input terminal receiving an input signal;
a first power source terminal supplying a high voltage;

a second power source terminal supplying a low voltage;

a first insulated gate field effect transistor of one conductivity type;

a second insulated gate field effect transistor of the other conductivity type connected in series with said first transistor between said first and second power source terminals;

a first protection circuit between said input terminal and a gate of said first transistor, said first protection circuit including a first diode connected between said gate of said first transistor and said first power source terminal and a first resistor having one end connected directly to said gate of said first transistor and the other end connected directly to said input terminal; and a second protection circuit between said input terminal and a gate of said second transistor, said second protection circuit being formed separately from said first protection circuit except for the common connection with said input terminal and including a second diode connected between said gate of said second transistor and said second power source terminal and a second resistor having one end directly connected to said gate of said second transistor and the other end connected directly to said input terminal.

9. A complementary transistor circuit as claimed in claim 8, wherein said first transistor and said first protection circuit are formed on a semiconductor substrate of one conductivity type and said second transistor and said second protection circuit are formed on a well region of the other conductivity type formed on said semiconductor substrate.

10. A complementary transistor circuit as claimed in claim 8, wherein said first transistor, said first resistor and said first diode are formed on a semiconductor substrate of one conductivity type, and said second transistor, said second resistor and said second diode are formed on a well region of the other conductivity type formed on said semiconductor substrate.

* * * * *